United States Patent [19]

Haluska et al.

[11] Patent Number: 5,436,083
[45] Date of Patent: Jul. 25, 1995

[54] PROTECTIVE ELECTRONIC COATINGS USING FILLED POLYSILAZANES

[75] Inventors: Loren A. Haluska; Keith W. Michael, both of Midland, Mich.

[73] Assignee: Dow Corning Corporation, Midland, Mich.

[21] Appl. No.: 221,597

[22] Filed: Apr. 1, 1994

[51] Int. Cl.6 .............................................. B32B 9/00
[52] U.S. Cl. .................................. 428/688; 427/228; 427/377; 427/387; 427/397.7; 428/698; 428/702; 428/704; 437/235; 437/238
[58] Field of Search ............... 427/226, 228, 377, 387, 427/397.7; 437/235, 238; 428/688, 698, 702, 764

[56] References Cited

U.S. PATENT DOCUMENTS 5,176,941  1/1993  Peuckert et al. ............. 427/228 X

FOREIGN PATENT DOCUMENTS 221466  9/1989  Japan .
52287   3/1991  Japan .
3250082 11/1991  Japan .
WO 02472 2/1993  WIPO .

*Primary Examiner*—Michael Lusignan
*Attorney, Agent, or Firm*—Roger E. Gobrogge

[57] ABSTRACT

The present invention relates to a method of forming protective coatings on electronic substrates and the substrates coated thereby. The method comprises applying a coating comprising a polysilazane and a filler on a substrate and heating the coated substrate at a temperature sufficient to convert the polysilazane to a ceramic.

18 Claims, No Drawings

PROTECTIVE ELECTRONIC COATINGS USING FILLED POLYSILAZANES

BACKGROUND OF THE INVENTION

The present invention relates to a method of forming protective coatings using compositions comprising polysilazanes and fillers. These coatings are useful on a variety of electronic substrates.

The use of polysilazanes to form ceramic coatings on electronic devices is known in the art. For instance, International Publication WO 93/02472 discloses a process for forming a coating on an electronic substrate wherein a solution of a polysilazane resin is applied to an electronic substrate followed by heating the coated substrate in air at a temperature in the range of 150°–800° C. This reference, however, does not describe the use of fillers within the coating.

Similarly, the use of fillers within ceramic coatings derived from polysilazanes is also known in the art. For instance, Japanese Patent Application Numbers 52287 and 221466 describe compositions comprising polysilazanes and fillers. These references, however, do not describe the use of such materials as protective coatings on the surface of electronic substrates.

Tonen in Japanese Patent Application 3250082 also describes the incorporation of an electroconductive powder within a ceramic derived from a polysilazane. This reference, however, does not describe protective coatings on the surfaces of electronic substrates.

The present inventors have now discovered that useful coatings for the protection of electronic devices can be formed from compositions comprising polysilazanes and fillers.

SUMMARY OF THE INVENTION

The present invention relates to a method of forming a protective coating on the surface of an electronic substrate and the substrates coated thereby. The method comprises first applying a composition comprising a polysilazane and a filler on the surface of the electronic substrate. The coated substrate is then heated at a temperature sufficient to convert the composition to a ceramic coating.

DETAILED DESCRIPTION OF THE INVENTION

The present invention is based on the discovery that desirable protective coatings can be formed on electronic substrates from a composition comprising a polysilazane and a filler. Coatings derived therefrom are thicker (eg., >40 micrometers) than those derived from polysilazanes (eg., <2 micrometers), they can have a variety of electrical properties depending on the filler and they can be crack and pore-free.

Because of the above advantages, these coatings are particularly valuable as protective coatings on electronic substrates. Such coatings could serve, for example, as passivation or dielectric coatings, interlevel dielectric layers, doped dielectric layers to produce transistor like devices, pigment loaded binder systems containing silicon to produce capacitor and capacitor like devices, multilayer devices, 3-D devices, silicon on insulator devices, coatings for superconductors, super lattice devices, tamperproof coatings and the like.

As used in the present invention, the expression "ceramic coating" is used to describe the hard coating obtained after heating the polysilazane—filler composition. This coating contains both amorphous silica ($SiO_2$) materials as well as amorphous silica-like materials that are not fully free of residual carbon (eg., Si—C), nitrogen (eg., Si—N), silanol (Si—OH) and/or hydrogen (eg., Si—H) (which are obtained upon heating the polysilazane) and the filler materials. The expression "filler" is used to describe a finely divided solid phase which is distributed within the polysilazane and the final ceramic coating. The expression "electronic substrate" is meant to include, but is not limited to, electronic devices or electronic circuits such as silicon based devices, gallium arsenide based devices, focal plane arrays, opto-electronic devices, photovoltaic cells and optical devices.

In the process of the present invention a protective ceramic coating is formed on a substrate by a process which comprises applying a coating composition comprising a polysilazane and a filler onto the substrate and then heating the coated substrate at a temperature sufficient to convert the polysilazane to a ceramic.

The polysilazanes (or silazane polymers) useful in this invention are generally well known in the art and their structure is not particularly critical. The polysilazanes of this invention generally contain units of the type [$R_2SiNH$], [$RSi(NH)_{1.5}$] and/or [$R_3Si(NH)_{\frac{1}{2}}$] wherein each R is independently selected from the group consisting of hydrogen, alkyl radicals containing 1 to 20 carbon atoms, aryl radicals, and alkenyl radicals. Naturally, the polysilazanes useful in this invention may contain other silazane units. Examples of such units include [$MeSi(NH)_{1.5}$], [$Me_2SiNH$], [$ViSi(NH)_{1.5}$], [$Vi_2SiNH$], [$PhMeSiNH$], [$PhViSiNH$], [$MeViSiNH$], [$HSi(NH)_{1.5}$], [$H_2SiNH$], and the like. Mixtures of polysilazanes may also be employed in the practice of this invention.

The polysilazanes of this invention can be prepared by techniques well known in the art. The actual method used to prepare the polysilazane is not critical. Suitable preceramic silazane polymers or polysilazanes may be prepared by the methods of Cannady in U.S. Pat. Nos. 4,540,803 (issued Sep. 10, 1985) and 4,543,344 (issued Sep. 24, 1985) which are hereby incorporated by reference. Other polysilazanes suitable for use in this invention can be prepared by the methods of Gaul in U.S. Pat. Nos. 4,312,970 (issued Jan. 26, 1982), 4,340,619 (issued Jul. 20, 1982), 4,395,460 (issued Jul. 26, 1983), and 4,404,153 (issued Sep. 13, 1983), all of which are hereby incorporated by reference. Suitable polysilazanes also include those prepared by the methods of Haluska in U.S. Pat. No. 4,482,689 (issued Nov. 13, 1984) and Seyferth et al. in U.S. Pat. No. 4,397,828 (issued Aug. 9, 1983), both of which are hereby incorporated by reference. Still other polysilazanes include those of Gerdau et al. in European Patent 351,747, those of U.S. Pat. No. 4,543,344, those of European Patent 332,374, those of Lebrun et al. in U.S. Pat. Nos. 4,656,300 and 4,689,252 and those of Funayama et al. in U.S. Pat. No. 5,030,744, the disclosures of which are all hereby incorporated by reference.

Especially preferred polysilazanes are those which have no carbon in the repeating units of the polymer since the resultant coatings have little carbon contamination. End blocking groups such as $Me_3Si(NH)_{\frac{1}{2}}$ are acceptable in such polymers since they will be removed during the subsequent pyrolysis steps.

The most preferred polymers to be used herein are those of Gaul in U.S. Pat. No. 4,340,619 and those of Cannady in U.S. Pat. No. 4,540,803. The silazane polymers of Gaul are prepared by contacting and reacting in an inert, essentially anhydrous atmosphere a chlorine containing disilane or mixture of chlorine containing disilanes of the general formula $(Cl_xR_ySi)_2$ with a disilazane having the general formula $(R_3'Si)_2NH$ at a temperature in the range of 25° C. to 300° C. while distilling volatile byproducts, wherein R is vinyl, an alkyl group of 1–3 carbon atoms or a phenyl group; R' is vinyl, hydrogen an alkyl group of 1–3 carbon atoms or a phenyl group; x has a value of 0.5–3; y has a value of 0–2.5 and the sum of x+y equals 3. An especially preferred embodiment of the Gaul invention involves the reaction of methylchlorodisilanes with hexamethyldisilazane to produce methylpolydisilylazane. The silazane polymers of Gaul may have a relatively high chloride ion content and it is preferred that such concentration be lowered before use in the present invention. A method for such removal is described in U.S. Pat. No. 4,772,516 granted to Mahone, which is hereby incorporated by reference. The method described therein comprises treating the polymer with ammonia for a time sufficient to remove the chlorine.

The silazane polymers of Cannady are prepared by a method which comprises contacting and reacting in an inert essentially anhydrous atmosphere, trichlorosilane with a disilazane at a temperature in the range of 25° C. to 300° C. while distilling volatile byproducts. The disilazane used in the process has the formula $(R_3Si)_2NH$ where R is selected from the group consisting of vinyl, hydrogen, phenyl and alkyl radicals containing 1 to 3 carbon atoms. An especially preferred embodiment of the Cannady invention involves the reaction of trichlorosilane with hexamethyldisilazane to produce hydridopolysilazane.

Although only several polymers are described above, nearly any polysilazane may be used herein.

The fillers used herein are known in the art for use in coatings with other polymers. These included various inorganic and organic fillers, especially inorganic fillers, in a variety of morphologies including, but not limited to powders, particles, flakes, microballoons and the like. Examples of inorganic fillers include synthetic and natural materials such as the oxides, nitrides, borides and carbides of various metals and non-metals such as glass, alumina, silica, silicon monoxide, zirconium oxide, titanium dioxide, tantalum oxide, niobium oxide, zinc oxide, tungsten oxide, ruthenium oxide, silicon nitride, aluminum nitride, titanium diboride, silicon carbide, boron carbide and boron nitride, calcium carbonate, high dielectric constant fillers such as the titanate, niobate or tungstate salts of metals such as strontium, zirconium, barium, lead, lanthanium, iron, zinc, and magnesium including, for example, barium titanate, potassium titanate, lead niobate, lithium titanate, strontium titanate, barium strontium titanate, lead lanthanium zirconium titanate, lead zirconium titanate and lead tungstate, radiopaque materials (materials which are inhibit penetration by radiation) such as the insoluble salts of barium, lead, silver, gold, cadmium, antimony, tin, palladium, strontium, tungsten and bismuth including, for example, salts such as carbonates, sulfates and oxides (eg., barium sulfate), optically opaque fillers such as inorganic pigments, silicon nitride powder, silicon carbide powder, aluminum nitride powder, silica, and alumina, tamperproof materials (materials which render heat on oxidation) such as magnesium, iron, tin, silicon and zinc, precipitated diatomire, aluminum silicate or other silicates, pigments, phosphors, wollostonite, mica, kaolin, clay, talc and the like. Also, some organic materials such as cellulose, polyamides, phenol resins and the like may be used.

The preferred fillers to be used herein depend on the intended use for the coating. For instance, if the coating is to be used as an interlevel dielectric, a material such as silica or alumina may be desirable so that the coating has a low dielectric constant (DK) (eg., less than 8). Similarly, if a coating having a high DK (eg., greater than about 12) is desired, a material such as barium titantate or lead niobate may be desirable. Similarly, if an opaque coating is desired, an optically or radiopaque (a material which renders the coating opaque to radiation) material may be desired.

The number average particle size and shape of the above fillers can vary over a wide range depending on factors such as the type of filler, the desired coating thickness, etc. Since the coatings are generally less than about 500 micrometers thick, particle sizes less than this are generally used. Preferred number average particle sizes are in the range of less than about 50 micrometers and the most preferred number average particle size is in the range of submicron to 10 micrometers.

The amount of filler used in the present invention can also be varied over a wide range depending, for example, on the quality and electrical characteristics desired in the final coating. Generally, however, the fillers are used in an amount less than about 90 weight percent based on the weight of the polysilazane to insure that enough resin is present to bind the filler. Obviously, smaller amounts of fillers (eg., 1–5 wt %) can also be used.

If desired, other materials may also be present in the coating composition. For instance, it is within the scope of the present invention to use a material which modifies the surface of the filler for better adhesion. Such materials can include, for example, silanes such as glycidoxypropyltrimethoxysilane, mercaptopropyltrimethoxysilane, and vinyltriacetoxysilane. Similarly, it is within the scope of the invention to include suspending agents such as cellulose, clay, fumed silica, stearates and the like in the coating composition. These and other optional components are known to those skilled in the art.

According to the process of the invention, the polysilazane, filler and any optional components are applied to the surface of a substrate. This can be accomplished in any manner, but a preferred method involves dissolving the polysilazane in a solvent and dispersing the filler and any optional components therein. This dispersion is then applied to the surface of the substrate. Various facilitating measures such as stirring and/or heating may be used to dissolve or disperse the polysilazane and filler and create a more uniform application material. Solvents which may be used include any agent or mixture of agents which will dissolve or disperse the polysilazane and filler to form a liquid mixture without affecting the resultant coating. These solvents can include, for example, aromatic hydrocarbons such as benzene or toluene, alkanes such as n-heptane or dodecane, ketones, esters, glycol ethers, or cyclic dimethylpolysiloxanes, in an amount sufficient to dissolve/disperse the above materials to the concentration desired for application. Generally, enough of the above solvent is used to form a 0.1–80 weight percent mixture, preferably 1–50 wt. percent.

If a liquid method is used, the liquid mixture comprising the polysilazane, filler, solvent, and, any optional components is then coated onto the substrate. The method of coating can be, but is not limited to, spin coating, dip coating, spray coating or flow coating. Similarly, the coating can be selectively deposited by a masking or silk screening process. Other equivalent means, however, are also deemed to be within the scope of this invention.

The solvent is then allowed to evaporate from the coated substrate resulting in the deposition of the polysilazane and filler coating. Any suitable means of evaporation may be used such as simple air drying by exposure to an ambient environment, by the application of a vacuum or mild heat (eg., less than 50° C.) or during the early stages of the heat treatment. It is to be noted that when spin coating is used, the additional drying period is minimized as the spinning drives off the solvent.

Although the above described methods primarily focus on using a liquid approach, one skilled in the art would recognize that other equivalent means would also function herein and are contemplated to be within the scope of this invention.

The polysilazane and filler coating is then typically converted to the ceramic by heating it to a sufficient temperature. Generally, the temperature is in the range of about 50° to about 1000° C. depending on the pyrolysis atmosphere. Preferred temperatures are in the range of about 100° to about 800° C. and more preferably 150°–500° C. Heating is generally conducted for a time sufficient to ceramify, generally up to about 6 hours, with less than about 3 hours being preferred.

The above heating may be conducted at any effective atmospheric pressure from vacuum to superatmospheric and under any effective oxidizing or non-oxidizing gaseous environment such as those comprising air, $O_2$, an inert gas ($N_2$, etc.), ammonia, amines, moisture, $N_2O$ etc.

Any method of heating such as the use of a convection oven, rapid thermal processing, hot plate, or radiant or microwave energy is generally functional herein. The rate of heating, moreover, is also not critical, but it is most practical and preferred to heat as rapidly as possible.

By the above methods a ceramic coating is produced on the substrate. The thickness of the coating can vary over a wide range (eg., up to 500 micrometers) as described above. These coatings smooth the irregular surfaces of various substrates, they are relatively defect free, they have excellent adhesive properties and they have a variety of electrical properties (eg, low DK and high DK). As such, they are particularly useful for a variety of electronic applications such as protective layers (eg., passivation, dielectric or tamperproof).

Additional coatings may be applied over these coatings if desired. These can include, for example, $SiO_2$ coatings, $SiO_2$/ceramic oxide layers, silicon containing coatings, silicon carbon containing coatings, silicon nitrogen containing coatings, silicon oxygen nitrogen coatings, silicon nitrogen carbon containing coatings and/or diamond like carbon coatings. Methods for the application of such coatings are known in the art and many are described in U.S. Pat. No.4,756,977, which is incorporated herein by reference. An especially preferred coating is silicon carbide applied by the chemical vapor deposition of silacyclobutane. This process is described in U.S. Pat. No. 5,011,706 which is incorporated herein by reference.

The following non-limiting examples are included so that one skilled in the art may more readily understand the invention.

EXAMPLE 1

Silica glass microballoons (SDT-60) with a number average particle size of 5 micrometers, 0.3 g, were ground in a mortar and pestle for several minutes to decrease the particle size. A coating composition was then formed by mixing the ground glass, 2 g of hydridopolysilazane (50 wt % solids in xylene) made by the method of Cannady in U.S. Pat. No. 4,540,803, 0.2 g Minusil, and 0.4 g glycidoxypropyltrimethoxysilane. A sonic probe was used for 20 seconds to completely disperse the materials. The coating composition was applied to the surface of an 11.4 sq cM aluminum panels using a 50 micrometer drawdown bar. The coating was allowed to dry for 1.5 hours. The coated panel was then heated at 500° C. for 1 hour. The coating was 12.5 micrometers thick and was crack-free at 1000x.

EXAMPLE 2

4 g plasma alumina with a number average particle size of 6 micrometers, 0.3 g, 2 g of hydridopolysilazane (50 wt % solids in xylene) made by the method of Cannady in U.S. Pat. No. 4,540,803, 0.4 g glycidoxypropyltrimethoxysilane and 1 g cyclic polydimethylsiloxane were mixed. A sonic probe was used for 30 seconds to completely disperse the materials. The coating composition was applied to the surface of an 11.4 sq cM aluminum panels using a 50 micrometer drawdown bar. The coating was allowed to dry for 5 minutes. The coated panel was then heated at 500° C. for 1 hour. The coating was 16.1 micrometers thick and was crack-free at 1000x.

What is claimed is:

1. A method of forming a protective coating on an electronic substrate comprising:
    applying a coating composition comprising effective filler forming amounts of a polysilazane and a filler onto an electronic substrate; and
    heating the coated substrate at a temperature sufficient to convert the polysilazane into a ceramic.

2. The method of claim 1 wherein the coating composition is applied to the substrate by a process which comprises coating the substrate with a liquid mixture comprising a solvent, the polysilazane and the filler and then evaporating the solvent.

3. The method of claim 2 wherein said liquid mixture is coated onto the substrate by spray coating, dip coating, flow coating, spin coating or silk screening.

4. The method of claim 2 wherein the coated substrate is heated at a temperature in the range of between about 50° C. and about 800° C. for less than about 3 hours.

5. The method of claim 2 wherein the coated substrate is heated in an environment containing one or more compounds selected from the group consisting of air, $O_2$, oxygen plasma, an inert gas, ammonia, amines, moisture, and $N_2O$.

6. The method of claim 1 wherein the coating composition also contains a material which modifies the surface of the filler.

7. The method of claim 1 wherein the coating composition also contains a suspending agent.

8. The method of claim 1 wherein the filler is in a form selected from the group consisting of powders, particles, flakes and microballoons.

9. The method of claim 1 wherein the filler has a particle size less than about 500 micrometers.

10. The method of claim 1 wherein the filler is present in the coating composition in an amount less than about 90 weight percent.

11. The method of claim 1 wherein the ceramic coating has a dielectric constant less than 8.

12. The method of claim 1 wherein the ceramic coating has a dielectric constant greater than 12.

13. The method of claim 1 wherein the filler is selected from the group consisting of the oxides, nitrides, borides and carbides of a metal or non-metal.

14. The method of claim 12 wherein the filler is selected from the group consisting of the titanate, niobate or tungstate salts of a metal.

15. The method of claim 1 wherein the filler is a radiopaque filler.

16. The method of claim 1 wherein the filler is an optically opaque filler.

17. The method of claim 1 wherein the filler is a tamperproof filler.

18. The substrate coated by the method of claim 1.

* * * * *